United States Patent
Fukagawa et al.

(10) Patent No.: US 6,636,394 B1
(45) Date of Patent: Oct. 21, 2003

(54) SPIN-VALVE MAGNETIC RESISTANCE SENSOR AND THIN-FILM MAGNETIC HEAD

(75) Inventors: Tomoki Fukagawa, Hyogo-ken (JP); Hiroshi Nishida, Osaka-fu (JP); Masateru Nose, Takaoka (JP); Fuminori Hikami, Osaka-fu (JP)

(73) Assignee: Read-Rite SMI Corp., Osaka (JP)

( * ) Notice: Subject to any disclaimer, the term of this patent is extended or adjusted under 35 U.S.C. 154(b) by 0 days.

(21) Appl. No.: 09/511,222

(22) Filed: Feb. 23, 2000

(30) Foreign Application Priority Data

Feb. 23, 1999 (JP) ............................................. 11-045077

(51) Int. Cl.$^7$ ................................................. G11B 5/39
(52) U.S. Cl. ................................................. 360/324.11
(58) Field of Search ........................ 360/324.11, 324.1, 360/324, 326, 313, 327.32; 428/692, 700, 670, 648

(56) References Cited

U.S. PATENT DOCUMENTS

| | | | |
|---|---|---|---|
| 4,103,315 A | * | 7/1978 | Hempstead et al. ........ 360/110 |
| 5,436,778 A | * | 7/1995 | Lin et al. ..................... 360/113 |
| 5,968,676 A | * | 10/1999 | Araki et al. ................. 428/692 |
| 6,057,049 A | * | 5/2000 | Fuke et al. .................. 428/700 |
| 6,165,607 A | * | 12/2000 | Yamanobe et al. .......... 428/332 |
| 6,307,720 B1 | * | 10/2001 | Hayakawa ................... 360/126 |
| 6,387,548 B1 | * | 5/2002 | Hasegawa et al. ........... 324/252 |

* cited by examiner

Primary Examiner—William Korzuch
Assistant Examiner—Angel Castro
(74) Attorney, Agent, or Firm—Burgess & Bereznak, LLP

(57) ABSTRACT

A spin-valve magnetic resistance sensor. In one embodiment, the spin-valve magnetic resistance sensor includes a pair of ferromagnetic layers with a non-magnetic layer sandwiched in between. The pair of ferromagnetic layers, the non-magnetic layer and an antiferromagnetic layer are laminated on a substrate. The antiferromagnetic layer is formed using an antiferromagnetic material which uses a Pt—Mn—X alloy, Ir—Mn—X alloy, Rh—Mn—X alloy, Ru—Mn—X alloy or Pd—Mn—X alloy. X indicates one or more elements selected from a set consisting of elements of groups IIA, IVA, VA, IIIB and IVB of the periodic table. X is in the range of 0.1 at % to 15 at %.

1 Claim, 3 Drawing Sheets

SPIN-VALVE MAGNETIC RESISTANCE SENSOR AND THIN-FILM MAGNETIC HEAD

BACKGROUND OF THE INVENTION

1. Field of the Invention

The present invention concerns a magnetic resistance type sensor used in a magnetic recording device, and specifically concerns a magnetic sensor and thin-film magnetic head which utilize the spin-valve magnetic resistance effect.

2. Background Information

Recently, magnetic resistance (MR) sensors consisting of a spin-valve film with a sandwich structure in which a pair of magnetic layers are laminated on a substrate with a non-magnetic layer sandwiched in between have been developed in order to increase the magnetic field sensitivity in playback magnetic heads by reducing the saturation magnetic field. In spin-valve films, the magnetization of one of the magnetic layers (i. e., the pin magnetic layer) is fixed in the direction of height of the element by an exchange-coupling magnetic field with the adjacent antiferromagnetic layer, while the magnetization of the other magnetic layer (i. e., the free magnetic layer) is converted into a single magnetic domain in the direction of the track width of the element, generally by a hard bias method utilizing the magnetic field of a permanent magnet, so that this magnetization can freely be caused to rotate by the external magnetic field.

As the unidirectional isotropic magnetic field created by the antiferromagnetic layer increases in magnitude, the pin magnetic layer can be more favorably converted into a single magnetic domain. Furthermore, as the magnetization of this layer becomes more sufficiently fixed, the linearity of the magnetic response to the external magnetic field is more reliably insured, so that the magnetic characteristics of the magnetic sensor are improved. As is described in for example Japanese Patent Application Kokai No. 9-35212, the characteristics required in the antiferromagnetic material used include the ability to obtain a large exchange-coupling magnetic field, the ability to raise the blocking temperature to a high temperature, superior corrosion resistance, a low heat treatment (annealing) temperature, and the ability to achieve a small film thickness, etc. In the past, various types of materials have been proposed.

Meanwhile, from the standpoints of obtaining a thin magnetic sensor, reducing power consumption and achieving a high recording density, etc., it is desirable that the abovementioned antiferromagnetic layer be made as thin as possible.

However, FeMn alloys, which have generally been used as antiferromagnetic materials in the past, suffer from the problem of susceptibility to corrosion. Furthermore, IrMn alloys, RhMn alloys and FeMn alloys, etc., are easily affected by the underlayer, and especially in the case of so-called bottom type spin-valve structures in which the antiferromagnetic layer is disposed on the substrate side and the pin magnetic layer is laminated on top of this antiferromagnetic layer, it is necessary to install an underlayer film with a high (111) crystal orientation, or to increase the film thickness. Furthermore, in the case of NiMn alloys, it is necessary to perform a heat treatment (annealing) at a high temperature in order to insure sufficient exchange-coupling with the pin magnetic layer. As a result, diffusion of the metal elements in the pin layer/non-magnetic layer/free layer occurs so that there is a danger of lowering the MR ratio.

In the spin-valve type thin-film magnetic head described in Japanese Patent Application Kokai No. 10-91921, the antiferromagnetic layer is formed from a PtMn alloy or PdMn alloy in order to eliminate such problems. According to the gazette of this application, PtMn alloys and PdMn alloys have a good corrosion resistance. Furthermore, these alloys show an effective exchange-coupling magnetic field when heat-treated at a low temperature of 230° C. or lower, and have a high blocking temperature, so that a favorable thin-film magnetic head which is superior in terms of thermal stability is obtained.

However, even in cases where such alloys are used in the antiferromagnetic layer, it is necessary to increase the (111) crystal orientation at the interface with the pin magnetic layer by increasing the film thickness to for example 250 angstroms or greater in order to insure a stable exchange-coupling magnetic field with a sufficient value. If the film thickness of the antiferromagnetic layer is increased to an excessive extent, the shunting of the sensing current into the antiferromagnetic layer increases, so that the problem of a drop in the MR ratio arises. Furthermore, from the standpoints of high recording density and reduction in the size of the magnetic head accompanying a reduction in the size of the overall apparatus, it is desirable to achieve a reduction in the thickness of the magnetic sensor.

SUMMARY OF THE INVENTION

A spin-valve magnetic resistance sensor is disclosed. In one embodiment, the spin-valve magnetic resistance sensor includes a magnetic resistance effect film having a pair of magnetic layers with a non-magnetic layer sandwiched in between. An antiferromagnetic layer is located adjacent to one of the pair of magnetic layers. The magnetic resistance effect film and the antiferromagnetic layer are laminated on a substrate. The antiferromagnetic layer includes an antiferromagnetic material including one of a Pt—Mn—X alloy, an Ir—Mn—X alloy, an Rh—Mn—X alloy, an Ru—Mn—X alloy or a Pd—Mn—X alloy. X is at least one element selected from groups IIa, IVa, Va, IIIb and IVb of a periodic table. The content of X is in a range of 0.1 at % to 15 at %.

Explanation of Symbols

Figure 1:
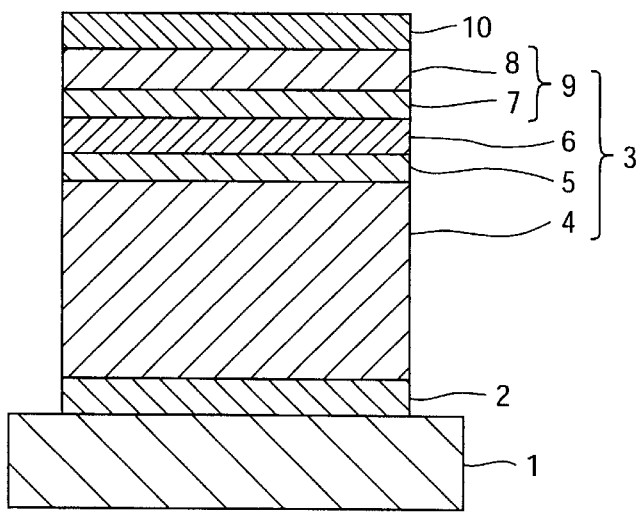
FIG. 1 is a model sectional view of the essential parts of a bottom spin-valve magnetic resistance sensor using the present invention, as seen from the ABS side.

1 Insulating layer
2 Underlayer
3 MR film
4 Antiferromagnetic layer
5 Pin magnetic layer 6 Non-magnetic coupling layer
7 CoFe film
8 NiFe film
9 Free magnetic layer
10 Protective film

DETAILED DESCRIPTION

The present invention was devised in light of the abovementioned conventional problems. One aspect of the present invention provides a spin-valve magnetic resistance sensor in which a good (111) crystal orientation can be obtained even if the antiferromagnetic layer of the magnetic resistance effect film is formed with a small thickness, so that a high exchange-coupling magnetic field can be realized, and in which the interacting magnetic field can be reduced so that the asymmetry of the playback output can be reduced.

Furthermore, another aspect the present invention provides a high-performance thin-film magnetic head which makes it possible to achieve a higher recording density and a smaller size as a result of being equipped with such a spin-valve magnetic resistance sensor.

The present invention provides a spin-valve magnetic resistance sensor which is equipped with a magnetic resistance effect film in which a pair of magnetic layers with a non-magnetic layer sandwiched in between, and an antiferromagnetic layer which is located adjacent to one of the aforementioned magnetic layers, are laminated on a substrate, said spin-valve magnetic resistance sensor being characterized by the fact that the aforementioned antiferromagnetic layer consists of an antiferromagnetic material [a] which is either a Pt—Mn—X alloy, an Ir—Mn—X alloy, an Rh—Mn—X alloy, an Ru—Mn—X alloy or a Pd—Mn—X alloy, [b] in which the aforementioned X consists of one or more elements selected from a set consisting of elements of groups IIA, IVA, VA, IIIB and IVB of the periodic table, and [c] in which the content of the aforementioned X is in the range of 0.1 at % to 15 at %.

As a result of the use of an antiferromagnetic material produced by adding a third element X to one of the abovementioned alloys, the antiferromagnetic layer shows an improvement in crystallinity and (111) orientation from the initially formed layer portions regardless of the crystal orientation of the underlying film layer. Accordingly, even if the thickness is reduced, a sufficient exchange-coupling magnetic field can be obtained, and the interacting magnetic field can be reduced.

In particular, the antiferromagnetic layer shows a good crystallinity and (111) orientation if [a] the aforementioned antiferromagnetic material consists of a Pt—Mn—X alloy, [b] the composition of this alloy is $(Pt_x—Mn_{1-x})_{1-y}—X_y$, and [c] x and y are respectively within ranges which are such that $5 \leq x \leq 20$ and $0.1 \leq y \leq 15$, or $36 \leq x \leq 54$ and $0.1 \leq y \leq 15$. Accordingly, such conditions are desirable. In this case, the antiferromagnetic layer can be effectively exchange-coupled with the pin magnetic layer by heat-treating (annealing) the antiferromagnetic layer at a temperature of 200° C. to 350° C.

Furthermore, a similarly favorable crystallinity and (111) orientation can be obtained if [a] the aforementioned antiferromagnetic material consists of an Ir—Mn—X alloy, [b] the aforementioned X consists of one or more elements selected from a set consisting of Ta, Zr and Nb, and [c] the content of the aforementioned X in the alloy is in the range of 0.1 at % to 15 at %.

Furthermore, another aspect of the present invention provides a thin-film magnetic head which has superior magnetic characteristics and which makes it possible to achieve a high recording density as a result of being equipped with the abovementioned spin-valve magnetic resistance sensor.

Below, a preferred working configuration of the present invention will be described in detail with reference to the attached figures.

FIG. 1 is a sectional view of a bottom spin-valve magnetic resistance sensor using the present invention, as seen from the ABS (air bearing surface) side. In this spin-valve magnetic resistance sensor, an underlayer 2 consisting of a Ta film with a thickness of 30 angstroms is formed on top of an alumina ($Al_2O_3$) insulating layer 1 which is installed on a substrate consisting of glass or a ceramic material such as silicon or $Al_2O_3$ATiC, etc., and a magnetic resistance (MR) film 3 with a bottom spin-valve structure is laminated on the surface of the abovementioned underlayer 2.

The MR film 3 has an antiferromagnetic layer 4 consisting of a Pt—Mn—X alloy which is laminated on the surface of the underlayer 2, a pin magnetic layer 5 consisting of a $Co_{90}Fe_{10}$ film with a thickness of 20 angstroms, a non-magnetic conductive layer 6 consisting of a Cu film with a thickness of 25 angstroms, and a free magnetic layer 9 consisting of a $Co_{90}Fe_{10}$ film 7 with a thickness of 10 angstroms and an $Ni_{80}Fe_{20}$ film 8 with a thickness of 50 angstroms. After being formed, the MR film 3 is subjected to a specified heat treatment, which is described later, in a vacuum magnetic field, so that the antiferromagnetic layer 4 is regularized, and so that a unidirectional isotropy is imparted to the pin magnetic layer 5, thus fixing the direction of magnetization of this layer. A protective film 10 consisting of Ta with a thickness of 30 angstroms is formed on top of the MR film 3.

The antiferromagnetic layer 4 has an fcc structure. Furthermore, the X contained in the Pt—Mn—X alloy consists of one or more elements selected from a set consisting of elements belonging to groups IIA, IVA, VA, IIIB and IVB of the periodic table, and the content of this X is in the range of 0.1 at % to 15 at %. In particular, $(Pt_{5\sim20}—Mn_{80\sim95})_{85\sim99.9}—X_{0.1\sim15}$ or $(Pt_{36\sim54}—Mn_{46\sim64})_{85\sim99.9}—X_{0.1\sim15}$ is especially desirable as such a film composition. This MR film is heat-treated for a specified time, for example 10 hours, at a temperature of 200° C. to 350° C.

As a result of the use of such a film composition, the antiferromagnetic layer 4 shows a good (111) crystal orientation from the initially formed layer portions even if no special underlayer with a high (111) crystal orientation is installed between the antiferromagnetic layer 4 and the substrate. Accordingly, even if the thickness of the antiferromagnetic layer is reduced compared to that of a conventional layer, sufficient exchange-coupling with the pin magnetic layer 5 can be obtained. Furthermore, the (111) orientation of the pin magnetic layer 5 formed on top of the antiferromagnetic layer is also improved.

Portions of both sides of the MR film 3 are removed by etching in accordance with a specified track width, and hard bias layers and conductive leads used as electrodes for the sensing current, etc., are formed. This laminated structure as a whole is further covered by an alumina insulating layer, thus completing the spin-valve MR sensor of the present invention.

Figure 2:
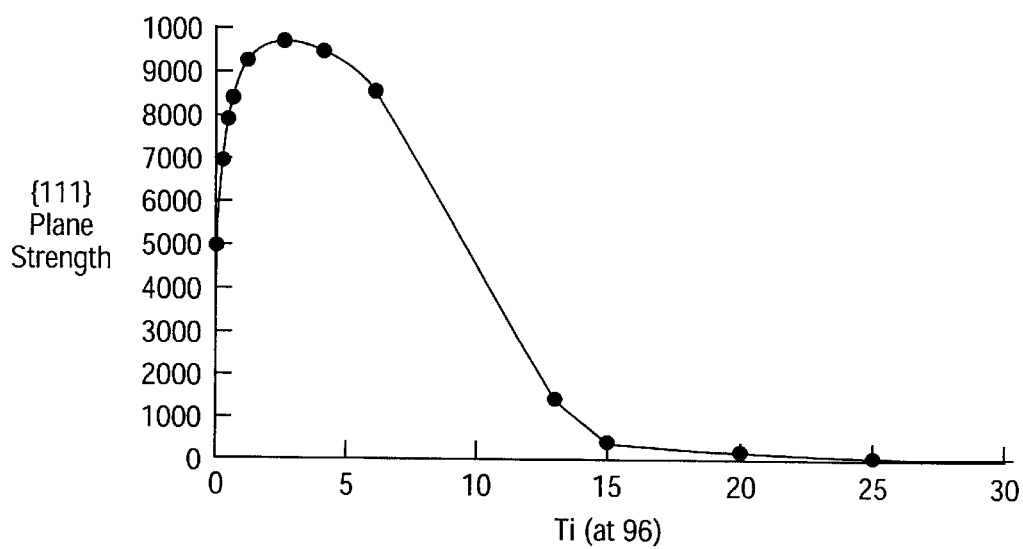
FIG. 2 is a graph which shows the relationship between Ti content (at %) and the strength of the (111) orientation in a case where an alloy with a composition of $(PtMn)_{1-y}Ti_y$ is used as the antiferromagnetic layer.

In the magnetic resistance sensor with a bottom spin-valve structure shown in FIG. 1, Ti of group IVA of the periodic table was selected as the aforementioned X, and the antiferromagnetic layer 4 was formed as an alloy with a composition of $(PtMn)_{1-y}Ti_y$. The strength of the (111)

orientation of the antiferromagnetic layer is plotted against this Ti content in FIG. 2. As is seen from FIG. 2, a strong (111) orientation was obtained at a Ti content of 0.1 at % to 15 at %.

Figure 3:
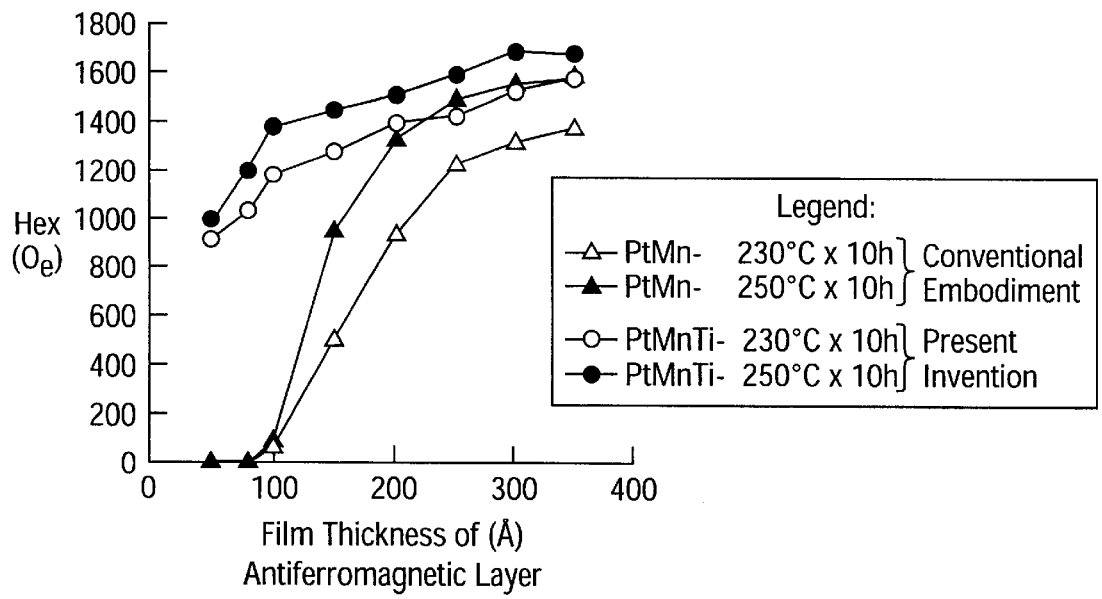
FIG. 3 is a graph which shows the relationship between the thickness of an antiferromagnetic layer consisting of a PtMnTi alloy and the exchange-coupling magnetic field $H_{ex}$.

Furthermore, FIG. 3 shows the relationship between the thickness of the antiferromagnetic layer and the exchange-coupling magnetic field $H_{ex}$ in this case. As a comparative example, an antiferromagnetic layer was formed using a conventional PtMn alloy for a spin-valve magnetic resistance sensor with the same structure as that shown in FIG. 1. The relationship between the thickness of the antiferromagnetic layer and the exchange-coupling magnetic field $H_{ex}$ is also shown in FIG. 3. Furthermore, these antiferromagnetic layers were heat-treated for 10 hours at 230° C. and 250° C. It is seen from FIG. 3 that while the desired exchange-coupling magnetic field $H_{ex}$ is obtained only at a film thickness of 200 angstroms or greater in the cases of an antiferromagnetic layer consisting of a conventional PtMn alloy, a sufficient exchange-coupling magnetic field $H_{ex}$ is obtained even at a thickness of less than 100 angstroms in the case of the antiferromagnetic layer of the present invention.

Figure 4:
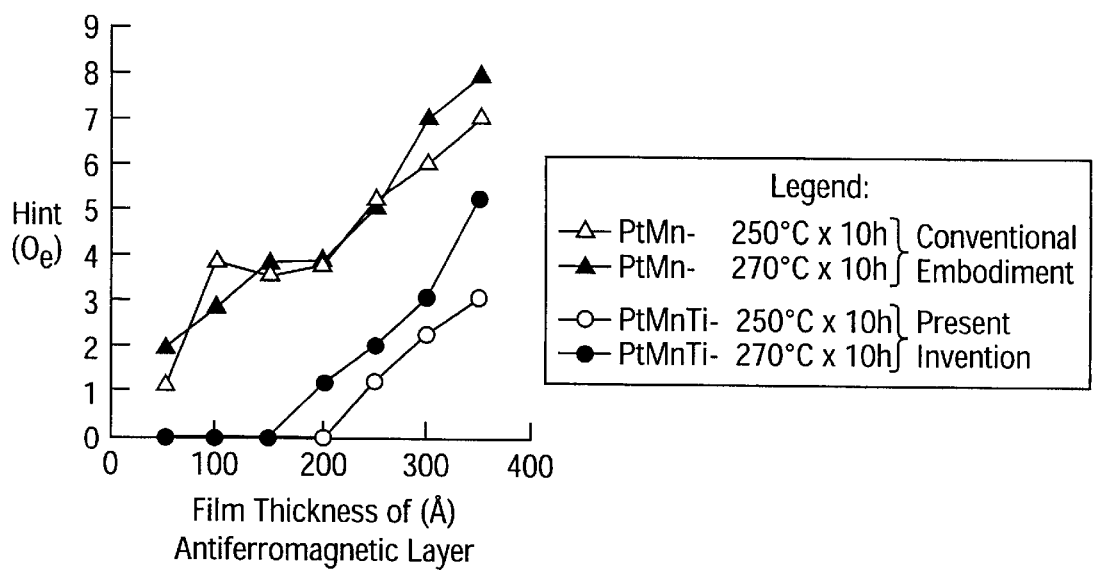
FIG. 4 is a graph which shows the relationship between the thickness of an antiferromagnetic layer consisting of a PtMnTi alloy and the interacting magnetic field $H_{int}$ between the pin magnetic layer and the free magnetic layer.

Furthermore, FIG. 4 shows the relationship between the thickness of an antiferromagnetic layer similarly formed from a PtMnTi alloy using Ti as X and the interacting magnetic field $H_{int}$. As a comparative example, the relationship between the thickness of an antiferromagnetic layer similarly formed from a conventional PtMn alloy and the interacting magnetic field $H_{int}$ between the pin magnetic layer and the free magnetic layer is also shown in FIG. 4. Furthermore, these antiferromagnetic layers were heat-treated for 10 hours at 250° C. and 270° C. It is seen from FIG. 4 that while the interacting magnetic field $H_{int}$ between the pin magnetic layer and the free magnetic layer shows a high value as a whole in the case of an antiferromagnetic layer consisting of a conventional PtMn alloy, the interacting magnetic field $H_{int}$ between the pin magnetic layer and the free magnetic layer shows a low value overall in the case of the antiferromagnetic layer of the present invention, and that this magnetic field is close to zero (Optical element) in the thin film thickness range of 250 angstroms or less, so that superior magnetic characteristics can be obtained.

Furthermore, it has been ascertained by the inventors of the present application that the blocking temperature at which the exchange-coupling magnetic field $H_{ua}$ is zero is also higher in cases where the antiferromagnetic layer of the present invention is used than it is in cases where an antiferromagnetic layer consisting of a conventional PtMn alloy is used, so that the sensor of the present invention is also thermally stable.

Furthermore, besides Ti, two or more other elements belonging to groups IIA, IVA, VA, IIB and IVB of the periodic table, or two or more such elements including Ti, may be selected as X in the aforementioned Pt—Mn—X alloy, and a similar effect can be expected in such a case.

In another embodiment, the antiferromagnetic layer 4 in FIG. 1 can be formed using an Ir—Mn—X alloy, Rh—Mn—X alloy, Ru—Mn—X alloy or Pd—Mn—X alloy instead of the abovementioned Pt—Mn—X alloy. In this case as well, the aforementioned X consists of one or more elements selected from a set consisting of elements belonging to groups IIA, IVA, VA, IIIB and IVB of the periodic table, and similar effect and merits can be obtained.

Figure 5:
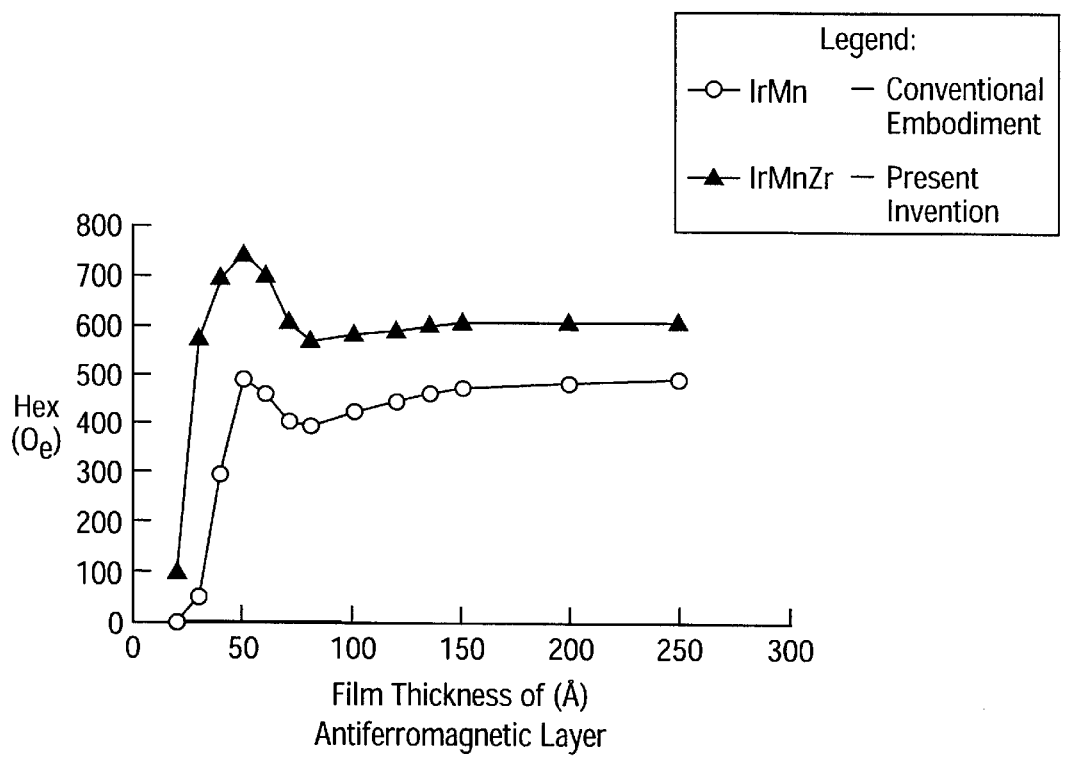
FIG. 5 is a graph which shows the relationship between the thickness of an antiferromagnetic layer consisting of an IrMnZr alloy and the exchange-coupling magnetic field $H_{ex}$.

FIG. 5 shows the relationship between the thickness of the antiferromagnetic layer and the exchange-coupling magnetic filed $H_{ex}$ in a case where the antiferromagnetic layer 4 was formed by an IrMnZr alloy using Zr as X in the spin-valve structure shown in FIG. 1. As a comparative example, the relationship between the thickness of an antiferromagnetic layer formed by a conventional IrMn alloy and the exchange-coupling magnetic field $H_{ex}$ is also shown in FIG. 5. It is seen from FIG. 5 that in contrast to an antiferromagnetic layer consisting of a conventional IrMn alloy, the antiferromagnetic layer of the present invention allows a sufficient exchange-coupling magnetic field $H_{ex}$ to be obtained even if the film thickness is reduced to 40 angstroms or less.

Furthermore, in the case of the aforementioned Ir—Mn—X alloy, similarly superior effects and merits can also be expected by using especially Ta or Nb, or a combination of these elements including Zr, as X instead of Zr.

Furthermore, the present invention can also be similarly applied to a so-called top spin-valve structure in which the antiferromagnetic layer is laminated on top of the pin magnetic layer on the opposite side from the substrate. As was described above, the antiferromagnetic layer of the present invention makes it possible to obtain a good (111) crystal orientation without any dependence on the underlayer that underlies this antiferromagnetic layer; accordingly, even if the film thickness is reduced, a sufficient exchange-coupling magnetic field can be obtained between the antiferromagnetic layer and the pin magnetic layer. Furthermore, the present invention can be applied to all types of spin-valve structures, and similar effects and merits can be obtained in such applications.

As is clear from the above description, the antiferromagnetic layer of a spin-valve film formed using the antiferromagnetic material of the present invention can insure a high (111) orientation and good crystallinity without any dependence on the underlayer underlying this antiferromagnetic layer, even if the thickness of this antiferromagnetic layer is reduced. Accordingly, the exchange-coupling magnetic field $H_{ex}$ can be increased to a high level, and the MR ratio can be improved. Furthermore, the interacting magnetic field $H_{int}$ is lowered, so that the asymmetry can be reduced, and the blocking temperature TB can also be increased compared to conventional films, so that thermal stability is obtained. As a result, furthermore, a magnetic head which offers high performance and high reliability, and which is capable of a high recording density, can be realized.

What is claimed is:

1. A spin-valve magnetic resistance sensor, comprising:
    a magnetic resistance effect film having a pair of magnetic layers with a non-magnetic layer sandwiched in between;
    an antiferromagnetic layer located adjacent to one of the pair of magnetic layers;
    an underlayer laminated to the antiferromagnetic layer, the antiferromagnetic layer and the one of the pair of magnetic layers having a {111} coherent crystal orientation;
    a substrate laminated to the underlayer; and
    wherein the antiferromagnetic layer has a thickness less than 50 angstroms and includes an antiferromagnetic material comprising one of a Ir—Mn—X alloy, wherein X comprises at least one of Ta or Nb, and wherein a content of X in the Ir—Mn—X alloy is in the range of greater than 0.1 at % to less than 10 at %.

* * * * *